United States Patent [19]

Luning et al.

[11] Patent Number: 5,650,343

[45] Date of Patent: Jul. 22, 1997

[54] SELF-ALIGNED IMPLANT ENERGY MODULATION FOR SHALLOW SOURCE DRAIN EXTENSION FORMATION

[75] Inventors: Scott Luning, Menlo Park; Roger Alvis, Cupertino, both of Calif.

[73] Assignee: Advanced Micro Devices, Inc., Sunnyvale, Calif.

[21] Appl. No.: 474,301

[22] Filed: Jun. 7, 1995

[51] Int. Cl.⁶ .................. H01L 21/265; H01L 21/8234
[52] U.S. Cl. .................. 437/36; 437/44; 437/931
[58] Field of Search .................. 437/40–41, 44, 437/36, 931

[56] References Cited

U.S. PATENT DOCUMENTS

| | | |
|---|---|---|
| 4,149,904 | 4/1979 | Jones . |
| 4,198,250 | 4/1980 | Jecmen . |
| 4,282,648 | 8/1981 | Yu et al. . |
| 4,366,613 | 1/1983 | Ogura et al. . |
| 4,430,792 | 2/1984 | Temple . |
| 4,590,663 | 5/1986 | Haken . |
| 4,728,617 | 3/1988 | Woo et al. .................. 437/30 |
| 5,257,095 | 10/1993 | Liu et al. . |
| 5,272,100 | 12/1993 | Satoh et al. .................. 437/29 |
| 5,508,209 | 4/1996 | Zhang et al. .................. 437/21 |

FOREIGN PATENT DOCUMENTS

| | | | |
|---|---|---|---|
| 5-343431A | 12/1993 | Japan | ................... 437/41 |
| 6-224147A | 8/1994 | Japan | ................... 437/21 |

OTHER PUBLICATIONS

Design and Characteristics of the Lighly Doped Drain–Source (LDD) Insulated Gate Field–Effect Transistor, Ogura, et al., IEEE 1980, month unknown.

Primary Examiner—John Niebling
Assistant Examiner—Richard A. Booth
Attorney, Agent, or Firm—Fliesler, Dubb, Meyer & Lovejoy

[57] ABSTRACT

A process for forming shallow and/or lightly doped regions of impurity concentration adjacent to source/drain semiconductor regions in a semiconductor device. In one embodiment, the invention comprises: (a) providing a semiconductor of a first conductivity type having a first surface; (b) forming a gate structure on said first surface, the gate structure including a gate oxide layer and a polysilicon layer, and a ledge; and (c) implanting an impurity of a second conductivity type into the material and the ledge whereby a portion of the implant enters the substrate after passing through the ledge area overlying the edge of the gate and enters the substrate to a first depth below the surface, while a second portion of the implant does not pass through the ledge and enters the substrate to a depth below the surface of the substrate deeper than the first portion. In addition, an apparatus is disclosed. The apparatus may include a substrate having a surface; an insulating layer on the surface of the substrate, having a surface; a gate material layer on the surface of the insulating layer, the gate material layer having a surface; and an overhanging ledge comprised of an etchable material, having a thickness sufficient to permit at least a portion of a dopant implant to penetrate said overhanging ledge provided on the surface of the gate material layer.

13 Claims, 5 Drawing Sheets

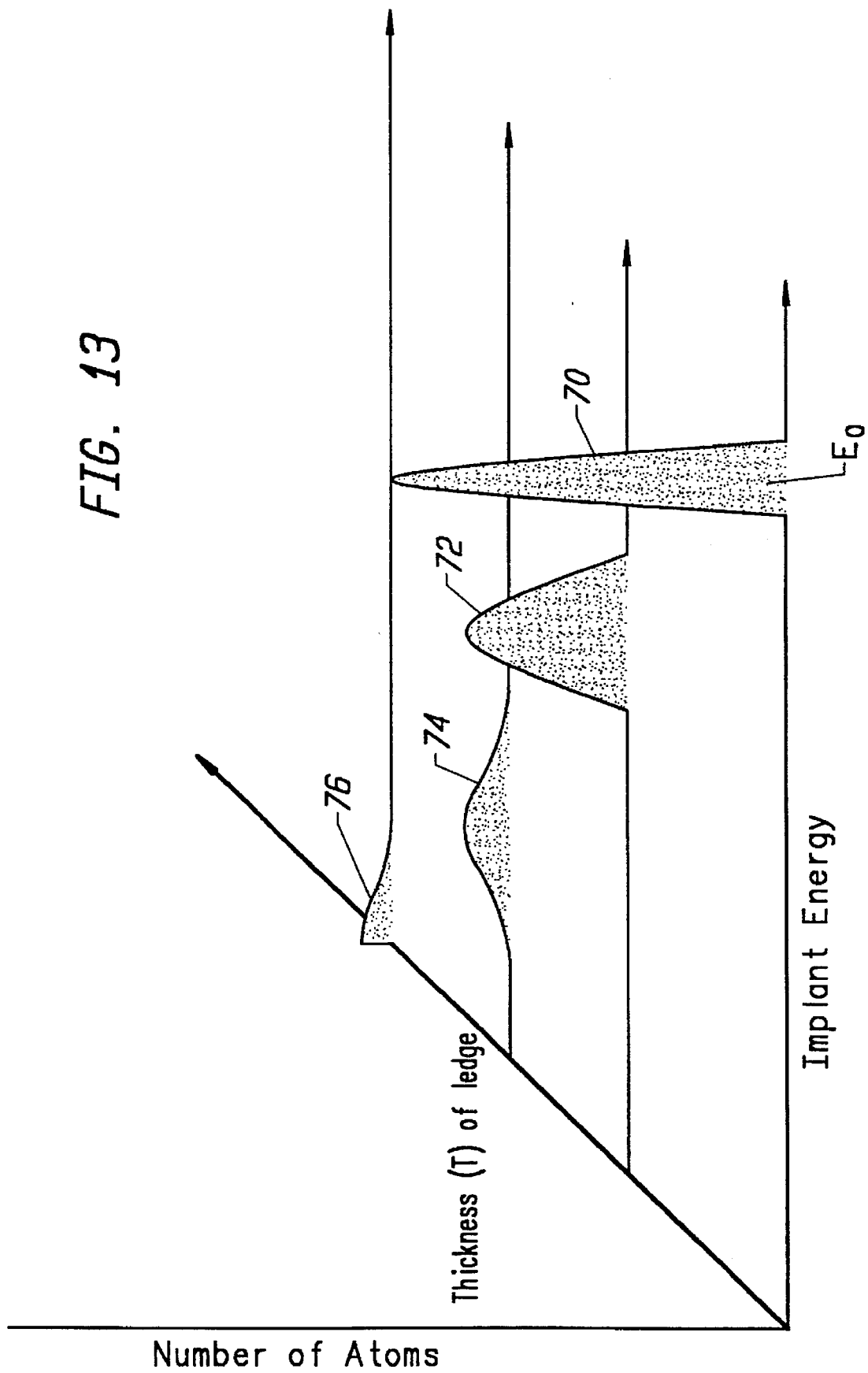

SELF-ALIGNED IMPLANT ENERGY MODULATION FOR SHALLOW SOURCE DRAIN EXTENSION FORMATION

BACKGROUND OF THE INVENTION

1. Field of the Invention

The invention relates to a method and structure for advantageously forming shallow and/or lightly doped source and drain extension regions in semiconductor devices.

2. Description of the Related Art

As integrated circuit manufacturers strive to provide more devices in smaller wafer areas, there is a continuing quest to define and produce transistors having ever-smaller overall cell geometries and that are capable of operating at increasing switching speeds. For the purposes of this disclosure, cell geometry is defined as the two-dimensional surface area required for implementing a single, integral active logic element, typically an N- or P-channel transistor or a pair of complementary transistors. Cell geometry can be distinguished from transistor geometry in that the latter refers to the three-dimensional structure of a single integral logic element.

A great deal of time and effort has been spent on producing the so-called Lightly Doped Drain-Source (LDD) semiconductor device, wherein shallow and/or lightly-doped extension regions are provided near the edges of the gate structure at the point within the transistor where a high degree of electric field strength occurs. Typically, these extension regions are formed adjacent to higher concentration, source/drain semiconductor regions. For purposes of this disclosure, the phrases "source/drain semiconductor region", "source region" or "drain region" may mean any surface conductive regions in a typical semiconductor device where connection is made to elements external to the device.

The typical LDD structure involves providing narrow, self-aligned, lightly-doped impurity regions between the device channel and more heavily doped diffusions of the source/drain regions in the device. It has been repeatedly shown that significant improvement in breakdown voltages, hot electron effects, and short channel threshold effects can be achieved using LDD regions, thereby allowing transistor operation at higher voltages and shorter channel lengths. Indeed, LDD technology is extremely advantageous in submicron channel length devices.

Typically, the lightly-doped drain region is more lightly doped and shallower than the source or drain semiconductor region, so as to minimally impact all other electrical characteristics of the drain-to-channel interface and to maximize the corresponding reduction of the electric field strength within the lightly-doped drain region. This reduction in field strength directly reduces the transfer of energy to charge carriers at the oxide/substrate interface with the corresponding reduction in the number of charge carriers injected into the gate oxide.

Typical devices constructed with LDD regions are shown in Ogura, et al. titled "Design and Characteristics of the Lightly Doped Drain-Source (LDD) Insulated Gate Field-Effect Transistor", IEEE publication, copyright 1980, and U.S. Pat. Nos. 5,257,095, 4,590,663, 4,282,648, and 4,366,613.

In general, the LDD structure can be fabricated using conventional planar silicon-gate processing techniques and optical lithography. One such conventional process for forming LDD regions in an n-channel transistor structure is shown in FIGS. 1–3. In FIG. 1, a gate structure 26 is shown. The structure 26 is formed by providing a p-type silicon substrate 20, and first covering substrate 20 with a thermally grown silicon dioxide layer 22 (or any suitable dielectric layer formed in accordance with well-known techniques). A gate material layer, such as polysilicon layer 24, is next deposited onto the oxide layer 22, and polysilicon layer 24 and possibly oxide layer 22 are patterned, exposed and etched using any conventional photolithographic etching techniques to form gate structure 26. A light implantation of an n type impurity 28 is thereafter provided to form a lightly doped area 30 in the surface layer of the substrate 20. As shown in FIG. 1, the gate structure 26 will block implantation of the n type impurity under the gate structure.

As shown in FIG. 2, spacer regions 32 are formed by depositing a dielectric material (typically silicon dioxide) over the surface of the gate structure 26 and the shallow n-region 30, and anisotropically etching the material (typically with a "dry" or plasma etch). As shown in FIG. 3, a subsequent n+ implant is utilized to form the source/drain regions 34 in p substrate 20. The n+ regions may be more deeply implanted or may become more deep during subsequent diffusions because they are more heavily doped. It should be noted that the LDD regions may be fabricated on both source/drain semiconductor regions, as shown in FIGS. 1–3; however, the benefits of the structure have been shown where the LDD region is formed on only one side of the gate structure, e.g. the drain region. In such cases, a mask may be provided to inhibit LDD formation on one side of gate structure 56.

While the prior art method for implementing the LDD regions in semiconductor devices has proved useful, improved methods are constantly being sought for reducing the production time of devices, and reducing the number of process steps and the complexity of the material required to manufacture such devices.

SUMMARY OF THE INVENTION

In one aspect, the invention comprises a process for forming shallow and/or lightly doped regions of impurity concentration adjacent to source/drain semiconductor regions in a semiconductor device. In one embodiment, the invention comprises: (a) providing a semiconductor of a first conductivity type having a first surface; (b) forming a gate structure on said first surface, the gate structure including a gate oxide layer and a polysilicon layer, and a ledge; and (c) implanting an impurity of a second conductivity type into the material and the ledge whereby a portion of the implant enters the substrate after passing through the ledge area overhanging the edge of the gate and enters the substrate to a first depth below the surface, while a second portion of the implant does not pass through the ledge and enters the substrate to a depth below the surface of the substrate deeper than the first portion.

In another aspect, the invention comprises an apparatus. The apparatus may include a substrate having a surface; an insulating layer on the surface of the substrate, having a surface; a gate material layer on the surface of the insulating layer, the gate material layer having a surface; and an overhanging ledge comprised of an etchable material, having a thickness sufficient to permit at least a portion of a dopant implant to penetrate said overhanging ledge provided on the surface of the gate material layer.

In a third aspect, the invention provides a method of fabricating complementary field effect transistors at a surface of a semiconductor substrate of a first conductivity type. The method comprises the steps of: preparing a surface area of said substrate for the fabrication of first and second transistors at first and second transistor surface area portions of said surface area, including providing a well region of a second conductivity type and encompassing said second transistor surface area portion; forming respective gate structures including an overhanging ledge portion, the gate structures overlying said first and second transistor surface area portions of said surface area; providing a first dopant under the otherwise exposed portion of a first one of said first and second transistor surface area portions; and providing a second dopant under the otherwise exposed portion of said surface area.

BRIEF DESCRIPTION OF THE DRAWINGS

The invention will be described with respect to the particular embodiments thereof. Other objects, features, and advantages of the invention will become apparent with reference to the specification and drawings in which:

FIG. 13 is a three-dimensional graph illustrating the doping characteristics of the method of the present invention.

DETAILED DESCRIPTION OF THE PREFERRED EMBODIMENTS

In general, the present invention presents a method of providing self-aligned, shallow and/or lightly doped extension regions adjacent to source/drain semiconductor regions in a semiconductor device. The process is implemented using a portion of a ledge layer on a gate stack to reduce the energy of an impurity dopant implant adjacent to the gate structure thereby forming shallow extension regions while the balance of the implant forms more deeply implanted source/drain semiconductor regions. In accordance with the invention, the gate structure and ledge material may be modified based upon the particular structure and device characteristics desired. Such modification, coupled with control of various device processing parameters such as impurity implantation energy and concentration during the formation of the semiconductor device, allow one to control the specific nature and properties of the semiconductor device in a novel and efficient manner.

Figure 1:
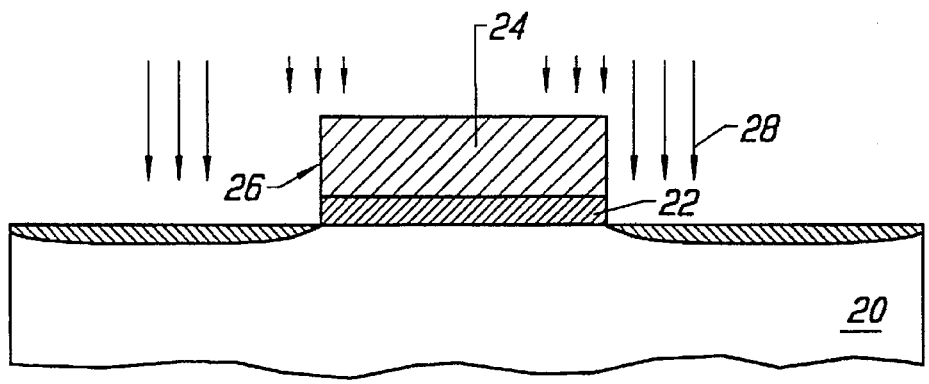
FIGS. 1–3 represent the prior art process steps utilized in forming lightly doped drain extension regions on one side of a semiconductor device.
Figure 2:
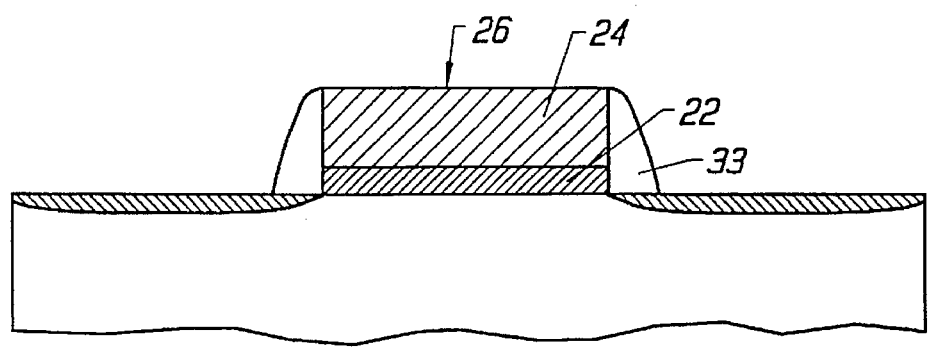
Figure 3:
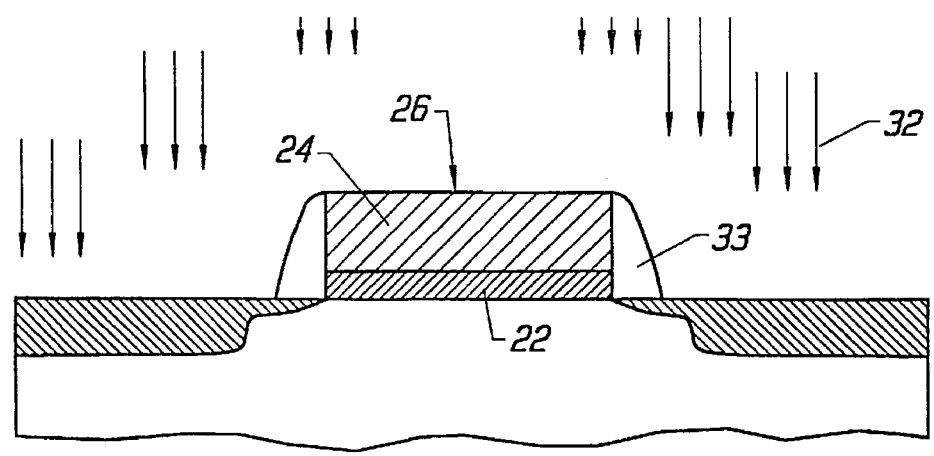
Figure 4:
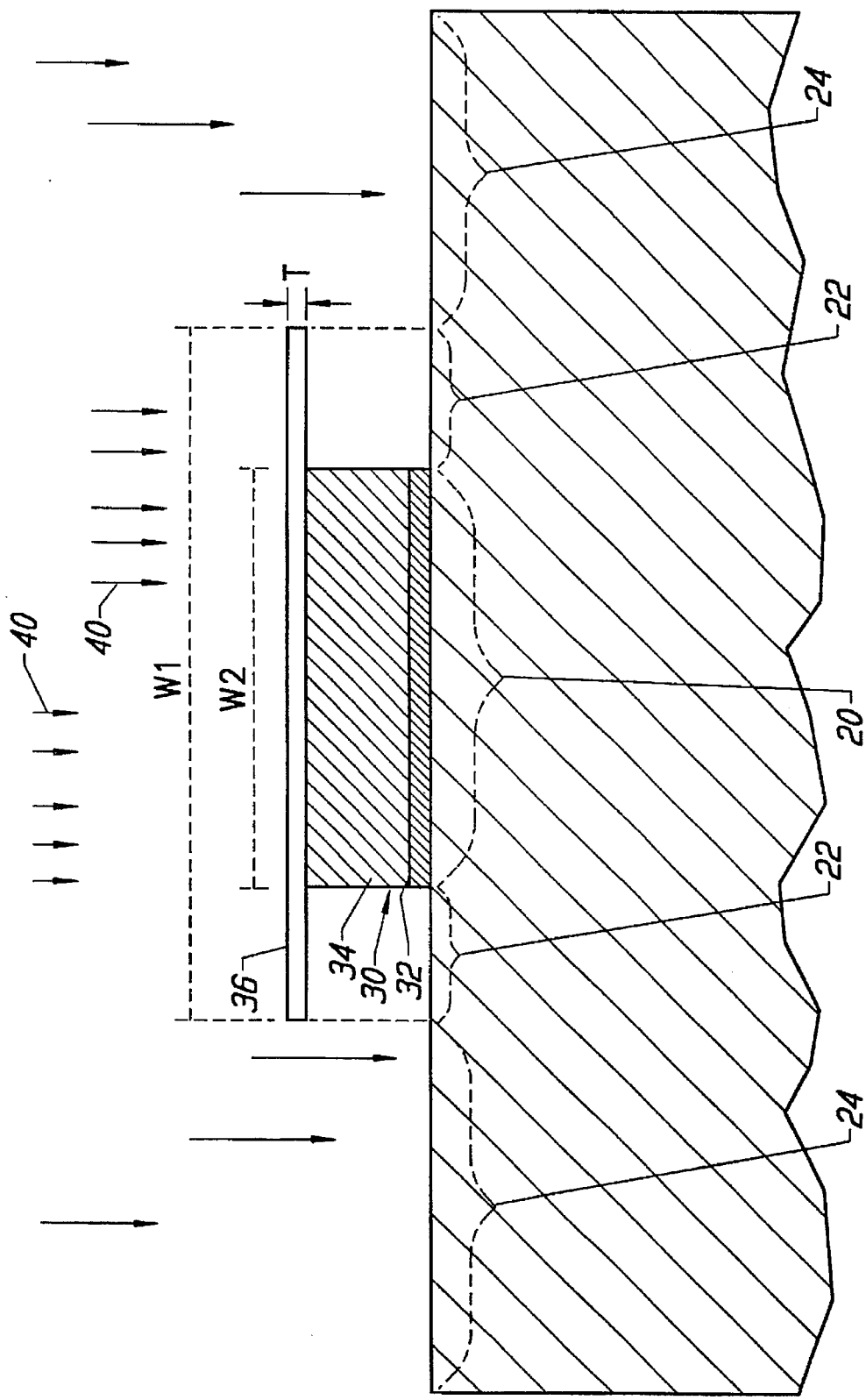
FIG. 4 is a cross-section of a semiconductor structure illustrating the novel aspects of the present invention.

FIG. 4 illustrates the basic principles of the invention. As shown in FIG. 4, a gate structure 30 comprises a layer of insulating material 32 (such as an oxide layer) and a layer 34 of gate material, such as polysilicon. (For purposes of this disclosure, the term "gate structure" refers to the formed (or etched) gate material layer and insulator layer. The term "gate stack" may include additional layers, such as the ledge material and conductive interconnects.) A layer of ledge material 36 overlies the gate structure and has a horizontal width $w_1$ which is greater than the width $w_2$ of the polysilicon region 34. The ledge material 36 acts as a penetrable mask for implant impurity ions, represented by arrows 40, which are directed toward the surface of substrate 50. The portions of the ledge layer overlying the substrate surface impede implantation in the overlying areas, resulting in three distinct regions of the structure as a result of implantation. In a region 20, underneath gate structure 30, the implant material 40 does not enter substrate 50 as gate structure 30 acts as a complete mask to implantation. In regions 22, underlying the portions of the ledge which are wider than gate structure 30, the energy of the implant will penetrate the areas (or overhangs) of ledge material 36 which extend beyond the width $w_2$ of gate structure 30 so that some or all of the implant arrives at the substrate with reduced energy to form shallow source drain extension regions. In regions 24, where the surface of substrate 50 is fully exposed to the implant, implant 40 arrives with its full energy and may thereby form a deeply implanted region. A key element in implementing the present invention is the thickness T of ledge layer 36. The thickness of the ledge layer will determine how the energy of the implant is modulated and the length of the overhang of the ledge will determine the length of the shallow source drain extension region.

In addition, as will be discussed below, several different materials are suitable to comprise ledge material 36; however, ledge 36 must be comprised of a different material than the material used for gate region 34 due to the need for differential etching of the two materials during ledge formation.

FIGS. 5–12 show one exemplary process for forming a semiconductor device in accordance with the present invention. The exemplary process will be described with reference to a p-type substrate and formation of an n-channel transistor. However, it should be well understood by one of average skill in the art that the principles of the invention are not limited to n-channel transistors but may also apply to p-channel transistors, and alternative technologies to CMOS.

Figure 5:
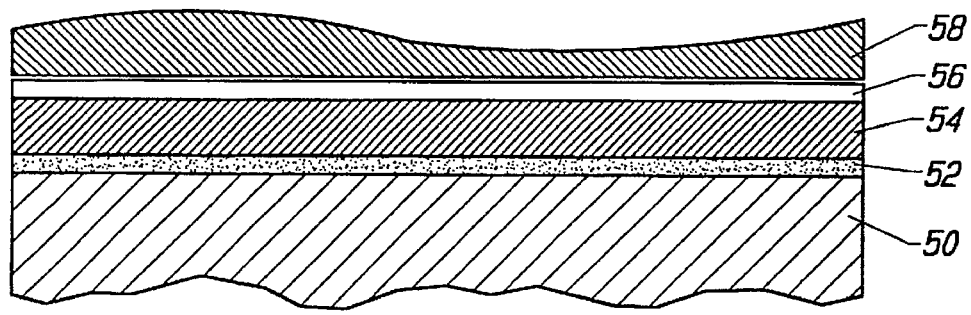
FIGS. 5–12 are cross-sections of a source/drain semiconductor region of a semiconductor substrate illustrating the process steps utilized in accordance with the present invention.

In FIG. 5, a p-type substrate 50 is shown. A layer of silicon dioxide ($SiO_2$) is provided on substrate 50 by thermally growing the oxide or by depositing the oxide using conventional chemical vapor deposition (CVD) processes. A suitable gate material 54 is thereafter deposited over oxide layer 52. The gate material 54 may be comprised of polysilicon, gallium arsenide (GaAs), conductive metals, a silicide or a combination thereof.

Thereafter, a ledge material of a desired thickness 56 is deposited on the gate material. The ledge material must be comprised of a different material than the gate layer material 54. As will be discussed further, two distinct etching steps are utilized in the invention, one anisotropic, and one isotropic, and the ledge material must be suitable for both purposes. Ledge material 56 may comprise a nitride material, such as $Si_xN_y$ or TiN, a silicide, or oxide.

The ledge material may thus be conducting or insulating, and such characterization provides variations in the processing sequence, as discussed further below. The important characteristic of the ledge material is that the isotropic etch have a high selectivity of gate material to ledge material.

An anisotropic etch is then performed in order to form a gate stack of width $w_1$. A layer of photoresist material 58 may be deposited over the ledge material layer 56. Patterning of the gate layer may take any conventional form, where photoresist 58 may be selected so that a dry etch, suitable for removing both the gate material and the ledge material while stopping at the oxide layer and providing vertical sidewalls, is used. The photoresist material is patterned by masking and exposing the photoresist in accordance with well-known techniques. The anisotropic etch is then performed, to yield the structure shown in FIG. 6. A portion of the gate oxide layer may be removed during the anisotropic etch step, as long as enough $SiO_2$ remains to complete processing of the device as discussed below. The first gate etch generally comprises an anisotropic etch so that substantially straight sidewalls remain for the ledge 56 and gate 54 materials. However, it is permissible that such etch not be strictly anisotropic (leaving some slope of the sidewalls), since such material will be etched back to form the overhang ledge during subsequent processing.

Figure 6:
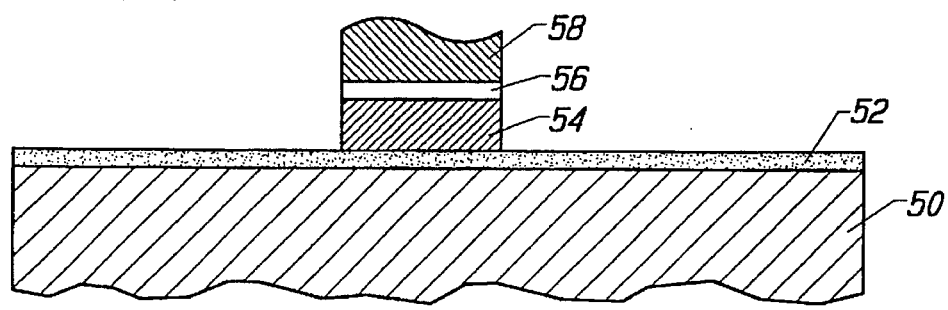

After completion of the anisotropic etch step, photoresist material 58 may be removed from the remaining structure as shown in FIG. 6 by any conventional solvent suitable for use with the photoresist selected. Alternatively, the photoresist material 58 may be allowed to remain during the following isotropic etch.

An isotropic etch is then performed to etch only the gate material layer 54 to a width $w_2$ without substantial etching of ledge material layer 56 and thereby leaving ledge material 56 at or near width $w_1$. The isotopic etch process must be selected so that little ledge material 56 is etched and no punch-through of the gate oxide layer 52 occurs. The isotropic etch can be a timed etch, since it is difficult to measure the endpoint of the gate etch. This is due to the fact that there is no real material transition, and measurement of the etched material will be difficult due to the overhanging ledge. Thus, selection of the etch characteristics resulting in high selectivity of the gate-to-ledge material 54–56 and the gate-to-oxide material 54–52 is required. As will be generally understood, the isotropic etch determines the final dimensions of the gate as it defines the width $w_2$ of the remaining gate material. The initial length of the gate material $w_1$ (and remaining length of the ledge material 56), less the width $w_2$ of the remaining gate material, will define the length of the lightly doped and/or shallow regions, as shown in FIG. 4.

Figure 7:
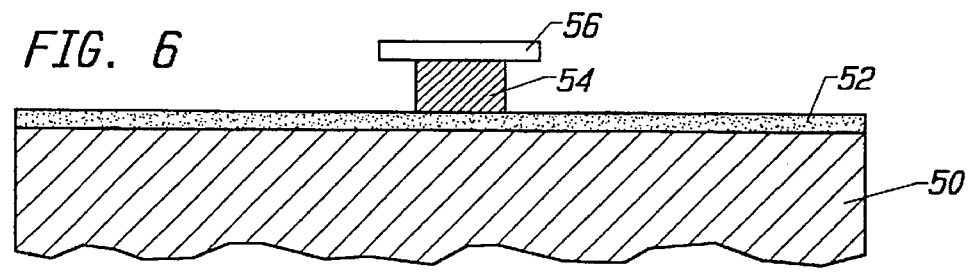
Figure 8:
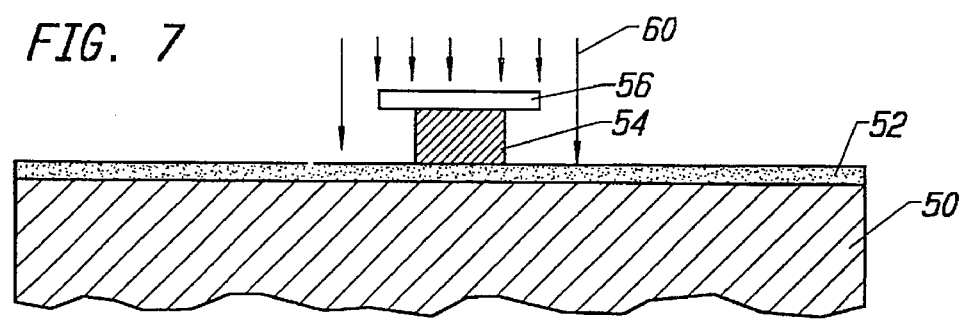
Figure 9:
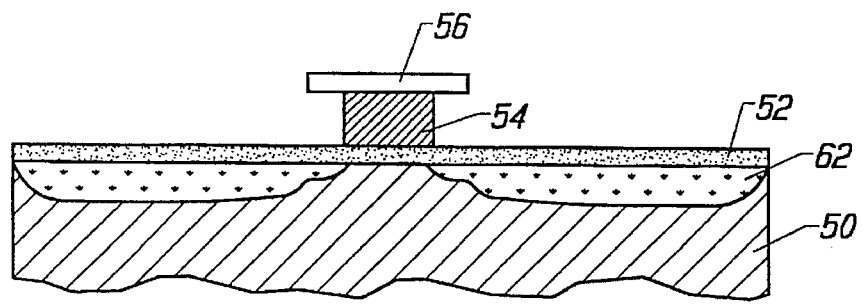

The isotropic etch results in the structure in FIG. 7. At this point, if photoresist 58 has not yet been removed, it may be stripped. As shown in FIG. 8, an implantation of an n-type impurity, represented by arrows 60, may then be performed. As discussed above with respect to FIG. 4, the impurity ions of the implantation 60 will enter substrate in the regions 22 underlying the overhanging ledge layer extending beyond the width $w_2$ of the gate material 54a. As shown in FIG. 9, the result will be deep implanted regions 62 with shallower, and possibly lightly doped extension regions 64. Regions 64 will be shallower than adjacent source/drain semiconductor regions since some implant energy will be adsorbed by the ledge overhang. However, if the thickness of the ledge overhang is sufficiently thin the impurity implantation may occur at an energy of in the range of approximately 5–120 keV using any suitable impurity, such as Arsenic, at an implant concentration in the source/drain semiconductor regions 62 of about $1 \times 10^{20}$ cm$^{-3}$. It should be noted that the invention is suitable for use with any range of implant energies and impurity concentration. As a result of the implantation, the shallow extension regions 64 will be formed simultaneously with the source/drain semiconductor regions 62, and will be self-aligned with respect to the gate.

FIG. 13 shows the relationship between the thickness of the ledge, the number of atoms which penetrate the ledge, and the implantation energy $E_0$. The energy of the implant is shown on the x-axis, the number of atoms penetrating the ledge is shown on the z-axis, the thickness of the ledge is shown on the y-axis. As one can determine from FIG. 13, the thickness of the ledge (T), the ledge material, and the implant energy may all be varied to control the implantation. Peak 70 represents the condition in region 24 of FIG. 4 where there is no ledge present, and all energy reaches the substrate material. The thickness of the ledge is at zero.

Peak 72 shows a condition where the thickness of the ledge is increased, the energy of the implant is reduced and somewhat dispersed, and nearly all of the dosage still reaches the surface of the substrate. As shown at peak 74, the energy is further reduced as the thickness of the ledge is increased.

As shown at peak 76, a significant fraction of the dopant does not make it through the ledge, but that which does arrives at the substrate with very low energies. Notably, the number of atoms reaching the substrate is reduced and the energy of the implant is further dispersed.

For ledges which are thicker than a certain critical value, no part of the implant will penetrate to the substrate. Thus, the thickness of the ledge is critical control process monitor, as is the energy of the implant, and the length of the overhang extension of the ledge over the substrate material outside of the gate structure which is defined by the extent of the isotropic gate etch.

An annealing step may thereafter be performed, by heating the structure shown in FIG. 9 at approximately 1000°–1050° Centigrade for a period of 10–30 seconds. However, any suitable rapid thermal anneal or furnace anneal process may be utilized.

As noted above, the ledge material may be a conductive or insulating material. If the ledge material is an insulator, gate spacer formation may proceed as shown in FIGS. 10–11.

Figure 10:
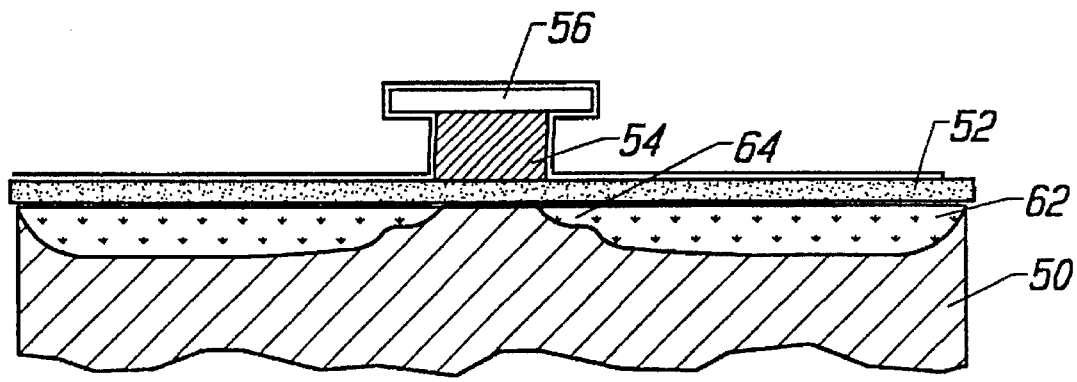
Figure 11:
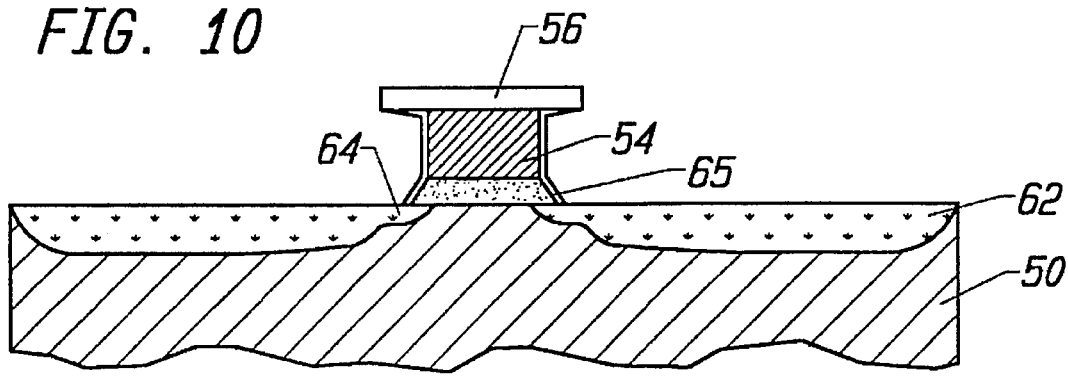

As shown in FIG. 10, a thin conformal spacer layer 64 may thereafter be deposited on the structure shown in FIG. 9. The conformal spacer layer 64 will be etched as shown in FIG. 11 to provide side walls for gate structure 55. As shown in FIG. 11, the conformal spacer layer 64 is etched to leave spacers 65 adjacent to each side of gate structure 55 and underlying ledge 56. Depending on the type of etch and ledge material used, the sidewall 65 may be protected by the ledge.

Figure 12:
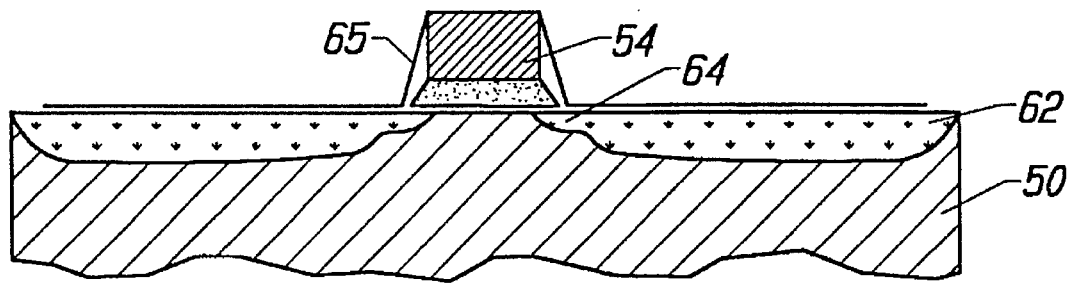

Finally, as shown in FIG. 12, ledge material 56 is stripped and the gate structure may be attached to an interconnect material, such as a conductive metal, refractory metal silicide or other suitable material. Although not shown, the ledge material may be stripped prior to depositing the conformal spacer layer. (Again, if the ledge material is a silicide, the ledge material may remain as part of an interconnect.)

Thus, the overlying ledge 56 allows the implant to form a self-aligned shallow source/drain semiconductor-region extension without the need for additional low energy and/or low dose implantation step utilized in the prior art. It further allows for formation of the oxide spacer region 65 after source drain annealing. This means that low temperature, low permitivity material can be utilized for some or all of the regions generally occupied by the spacer, thus reducing fringing gate capacitance. Finally, final gate dimensions are less than the printed gate mass by a controlled amount (two times the undercut distance), allowing a shorter length for a given lithography.

The many features and advantages of the present invention will be obvious to one of average skill in the art. All such features and advantages are intended to be within the scope of the invention as defined by the written description, the drawings, and the following claims.

What is claimed is:

1. A process for forming a semiconductor device, comprising the sequential steps of:

providing a semiconductor substrate having a first conductivity type and a surface;

forming an insulator layer on the surface of the substrate;

depositing a layer of gate material over the insulating layer;

depositing a ledge material over the gate material layer;

depositing a layer of photoresist material over the ledge material;

exposing the photoresist material to radiation;

chemically etching said photoresist material, ledge material, and gate material layer to provide a gate structure;

removing the photoresist material;

isotropically etching the gate material layer and at least a portion of the gate oxide layer such that the horizontal width of the gate material layer and the gate oxide is less than the horizontal width of the remaining ledge material; and implanting into said substrate, a material of a second conductivity type at a sufficient energy to penetrate the ledge material.

2. The method of claim 1 further including, prior to said step of depositing ledge material over the gate material layer, the step of determining a thickness for the ledge material based upon an implantation energy for the implanting step, and the desired depth of a doped region created by the implanting step.

3. The method of claim 2 wherein the step of implanting includes implanting at an energy of in the range of approximately 5–120 keV.

4. The process of claim 1 wherein the insulating layer comprises an oxide and the conductive layer comprises polysilicon.

5. The method as defined in claim 1 wherein the gate material comprises polysilicon.

6. The method as defined in claim 1 wherein the ledge material comprises a nitride.

7. The method as defined in claim 1 wherein said implanting step comprises implanting Arsenic.

8. The method as defined in claim 7 wherein said implanting step comprises implanting at an energy of approximately 80 kev.

9. The process of claim 1 further including the step of:

heating the substrate at a temperature of approximately 1050 degrees Celsius for a period of approximately 10 seconds.

10. The method of claim 9 further including the step of:

forming a dielectric spacer layer on the surface of the insulator layer, and the ledge material.

11. The method of claim 10 further including the step of:

etching the dielectric spacer layer to leave spacers adjacent to the gate material, the spacers separated by the width of the remaining gate material.

12. The method of claim 11 further including the step of stripping said ledge material.

13. The method of claim 10 further including the step of stripping said ledge material.

* * * * *